United States Patent
Gupta et al.

(10) Patent No.: US 7,022,534 B2
(45) Date of Patent: Apr. 4, 2006

(54) OPTIMAL BANK HEIGHT FOR INKJET PRINTING

(75) Inventors: Rahul Gupta, Milpitas, CA (US); Andrew Ingle, Fremont, CA (US); Sriram Natarajan, Burlingame, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/758,430

(22) Filed: Jan. 14, 2004

(65) Prior Publication Data
US 2005/0153468 A1    Jul. 14, 2005

(51) Int. Cl.
*H01L 21/00* (2006.01)

(52) U.S. Cl. .......................................... 438/21; 257/40
(58) Field of Classification Search ................. 438/21, 438/30, 69, 147, FOR 157, FOR 287; 257/40, 257/51, 79, 86
See application file for complete search history.

(56) References Cited

U.S. PATENT DOCUMENTS

| | | | |
|---|---|---|---|
| 6,517,996 B1 * | 2/2003 | Chao et al. | 430/321 |
| 6,762,552 B1 | 5/2003 | Duineveld et al. | |
| 6,774,392 B1 * | 8/2004 | Humbs et al. | 257/40 |

\* cited by examiner

*Primary Examiner*—David Nelms
*Assistant Examiner*—Calvin Lee
(74) *Attorney, Agent, or Firm*—Anand Sethuraman

(57) ABSTRACT

The height of the photo-resist layer "banks" which define pockets for inkjet printing or other patterned processes is optimized to provide a more uniform drying profile for substances which are to be deposited in those pockets and dried therein. Preferably, the height of the photo-resist layer is less than or equal to about three microns and more, preferably, about one micron.

16 Claims, 7 Drawing Sheets

US 7,022,534 B2

OPTIMAL BANK HEIGHT FOR INKJET PRINTING

BACKGROUND

1. Field of the Invention

This invention relates generally to the art of thin film device processing and fabrication. More specifically, the invention relates to the fabrication of Organic Light Emitting Diode based displays and other electronic devices which use selective deposition.

2. Related Art

Display and lighting systems based on LEDs (Light Emitting Diodes) have a variety of applications. Such display and lighting systems are designed by arranging a plurality of optoelectronic elements ("elements") such as arrays of individual LEDs. LEDs that are based upon semiconductor technology have traditionally used inorganic materials, but recently, the organic LED ("OLED") has come into vogue for certain applications. Examples of other elements/devices using organic materials include organic solar cells, organic transistors, organic detectors, and organic lasers. There are also a number of bio-technology applications such as biochips for DNA recognition, combinatorial synthesis, etc. which utilize organic materials.

An OLED is typically comprised of two or more thin at least partially conducting organic layers (e.g., an electrically conducting hole transporting polymer layer and an emissive polymer layer where the emissive polymer layer emits light) which are sandwiched between an anode and a cathode. Under an applied forward potential, the anode injects holes into the conducting polymer layer, while the cathode injects electrons into the emissive polymer layer. The injected holes and electrons each migrate toward the oppositely charged electrode and recombine to form an exciton in the emissive polymer layer. The exciton relaxes to a lower energy state by emission of radiation and in process, emits light.

Each of the OLEDs can be a pixel element in a passive or active matrix OLED display. Such pixels can be arranged in a row-column fashion and would be addressed and switched on/off differently depending upon whether the display was active or passive matrix. In the passive matrix case, each pixel is not individually addressed by a switch, but rather pixels are addressed using a combination of row lines and a column lines. In active-matrix displays, each pixel is controlled by its own switch (e.g. transistor based) which allows it to remain on until switched off.

FIG. 1 illustrates a cross-section of a typical OLED pixel. OLED pixel 100 includes a patterned anode layer 102 (typically the columns) that are patterned into stripes on top of a substrate 101. Anode layer 102 is typically composed of a transparent conducting oxide such as ITO (Indium Tin Oxide) or Fluorine-doped Tin Oxide. After anode patterning (usually via a photolithography and etching step), metal lines (not shown) may be patterned upon part of the anode pattern using methods known to those of ordinary skill in the art (e.g. metal deposition, photolithography and/or etch).

FIG. 1 depicts a metal cathode layer 104 that is laid down, typically on top of various polymer layers 108 and 109, to provide electrical connection for the active pixel area formed consequently. The pixel 100 illuminates under an application of a forward biased voltage as discussed above. The polymer layers 108 and 109 are typically formed by depositing a gel or liquid substance on the device and then spinning the device to spread out the deposited substance. This is referred to as spin coating. In other cases, the gel or liquid can be deposited and simply evaporated/dried for a period of time. In selective deposition techniques, such as inkjet printing (described below) pockets are formed into which the gel or liquid can be deposited drop by drop.

In the configuration shown, polymer layer 109 is usually an emissive polymer layer. Typically, polymer layer 108 is a conducting polymer layer which is also called a hole transport layer because it transports holes from the anode layer into the emissive polymer layer 109. The order in which layer 108 and 109 are deposited would be reversed if layer 104 were the anode layer and layer 102 the cathode layer. As mentioned above, one method of fabricating polymer layers is to drop a liquid or gel onto the lower electrode layer or other underlying surface and allow it to dry. The polymer liquid is deposited in drops and allowed to spread out on the exposed surface of the anode layer and then dry into a film. In the case of selective deposition such as inkjet printing, however, pockets that are formed by photo-resist banks can often affect the spreading/flow/drying and affect the shape of the film.

While spin coating of polymers may be appropriate for monochrome light emission, it is generally not used when a pattern of pixels of different colors is desired. For instance, if a particular pixel is to emit red light, a red emissive polymer material would be deposited in the region of that pixel, while for a blue emission a blue emissive polymer material would be deposited. In such cases, it is typical to have layer of photo-resist that form pockets defining discrete deposition regions to confine the deposited liquids and avoid intermixing of different colors as shown in FIG. 2.

FIG. 2 illustrates an anode line 210 that has a layer of photo-resist 220 above it. The photo-resist 220 is patterned (in case of photolithography the photo-resist is developed away, while for screen printing, the photo-resist can be deposited where needed) to define a pocket 230 where the anode 210 is exposed. The pocket 230 defines an individual pixel region and defines an area upon which polymer layers can be deposited. Unlike the spin coating case, each pocket, thus formed, is isolated from the pocket of another pixel location in that the same substance dropped therein does not spread and overlap with that other pocket. FIG. 2 shows a cross-section cut in the same direction as the direction in which anode line 210 and other anode lines are patterned. A cross-section in the transverse direction to that shown in FIG. 2 would also show photo-resist with the same shape as photo-resist 220. This layer of photo-resist patterned as shown define individual pockets as illustrated in FIG. 3. The extra layer of photo-resist needed to define pockets typically has the shape shown in photo-resist 220 such that no portion of the photo-resist 220 overhangs into the pocket 230. The polymer(s) is/are dropped into the pocket 230 and allowed to dry or be evaporated.

In conjunction with these pockets, the process of inkjet printing has been used especially where a specific pattern of pixels are desired. For instance, in an OLED display where some individual pixel locations emit red light, while others emit green and yet others emit blue, inkjet printing would allow such a pattern to be created. FIG. 3 shows an inkjet printing system for an OLED that is to have RGB (red, green and blue) patterned pixels. The cross-section section shown in FIG. 3 is perpendicular to the cross-section shown in FIG. 2 and is taken in a direction perpendicular to the direction in which anode lines 360 are patterned. A print head 350 contains different polymers or other organic or organometallic substances including a red light emissive polymer substance, a green light emissive polymer substance and a blue light emissive polymer substance. These three polymers substances are delivered, respectively, via nozzles 332, 322 and 312. (although it is possible to deposit a different material from each nozzle, industrial printers are not designed like that. Usually all nozzles are used to deposit one material and the different materials are deposited sequentially). When delivered, the polymer substances drop onto pockets formed over an anode layer 360 (or onto the conducting polymer layer 330 which may also have been deposited using an inkjet head similar to the inkjet head 350 shown in FIG. 3). When the red, green and blue emissive polymer substances dry or evaporate, they form red polymer layer 334, green polymer layer 324 and blue polymer layer 314, respectively. One example shown is pocket 390 which has a green emitting polymer dropped therein to form green emitting polymer layer 324 (top view).

The red, green and blue pixels are patterned into a pattern using photo-resist layer 340 which will ensure that the correct polymer substances are deposited into only that specific pocket of the OLED display which it defines. The pattern shown is merely illustrative of one of many possible patterns of red, green and blue pixels. The use of a photo-resist layer to define pockets for inkjet printing is disclosed in published patent application No. U.S. 2002/0060518 A1 entitled "Organic Electroluminescent Device and Method of Manufacturing Thereof". As shown, the photo-resist 340 has a normal slope such that the top of the photo-resist 340 does not overhang the pocket. The typical height of the photo-resist banks is between 3 and 10 microns (when measured from the base) as currently practiced in the industry. Photo-resist banks are of such height to ensure that deposited drops do not spill over the walls of the photo-resist. However high photo-resist banks can lead to non-uniform and concave drying patterns. The profile, when dried from a liquid drop, will not be very flat or uniform.

As can be observed, the drying pattern is very non-uniform and shows a piling up on the edges of the drop 400 in FIG. 4. This is due to the difference in the rate of evaporation in different regions of the drop 400. This difference causes the substance to move towards the edges of the drop 400 from the middle, and hence the ultimate deposition of more of the substance at the edge than in the middle. This phenomenon is usually referred to as the Marangoni effect. A common example of this phenomenon is the stain left behind by drying of a coffee drop which shows more prominence (is darker in color) on the edges of the stain than in the center.

When there are normal sloping banks as in the case of drop 410, there is still substantial non-uniformity in the profile of the drop when dried. There is pileup at the edges which affects the useful part of the device. This pileup is due in part to the "pinning" of the liquid against the wall of the photo-resist bank. The liquid volume often exceeds the height of the banks as shown. The higher the pinning line is, the more pile-up at the edges when compared to the rest of the dried film. With the thicker dried film, the thickness of the layer 330 and 334 thus increases (see FIG. 3), the current through that part of the film decreases leading to less light being emitted from the part of the pocket with thicker layer(s) 330 and 334. In addition the higher current density in the thinner part of the film would lead to faster degradation of the sample and hence a shorter lifetime of the device/product.

It would be desirable to optimize the height of the banks such that the drying polymers are more uniform in thickness and thus have a flatter profile than is traditionally observed.

SUMMARY

In accordance with the invention, the height of the photo-resist layer "banks" which define pockets for inkjet printing or other patterned processes are optimized to provide a more uniform drying profile for substances which are to be deposited in those pockets and then dried therein. Preferably, the height of the banks is under three microns in height, while tall enough to prevent any spillage of liquid over the banks. In some embodiments of the invention, the height of the mushroom banks is set to be one micron or less.

DETAILED DESCRIPTION OF THE INVENTION

In accordance with the invention, the height of the photo-resist layer "banks" which define pockets for inkjet printing or other patterned processes are optimized to provide a more uniform drying profile for substances which are to be deposited in those pockets. Preferably, the height of the banks are less than three microns, and more preferably, down to a height of one micron. A lower bank height reduces the level of build-up on and near the walls of the banks and induces a more uniform and flatter profile when a substance dropped into a pocket is allowed to dry.

The amount of substance deposited within the banks, as well as the composition (properties) of the deposited substance contribute to the drying profile and thus, are factors in determining the optimal height of the photo-resist banks. In addition, the materials used in constructing the banks and surface treatments on the lower electrode layer and the photo-resist bank layer (or already deposited polymer layer) may affect the rate/direction of spread, affinity, etc. of the dropped substance and therefore, the drying profile of the resulting film.

Figure 1:
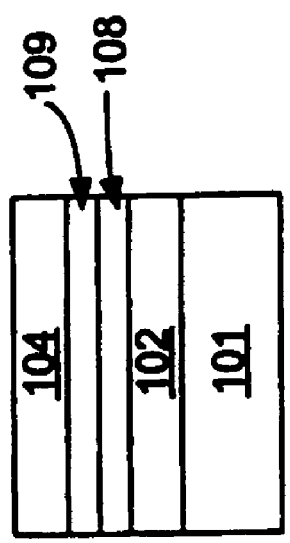
FIG. 1 illustrates a display device composed of OLED pixels under manufacture.
Figure 1:
Figure 2:
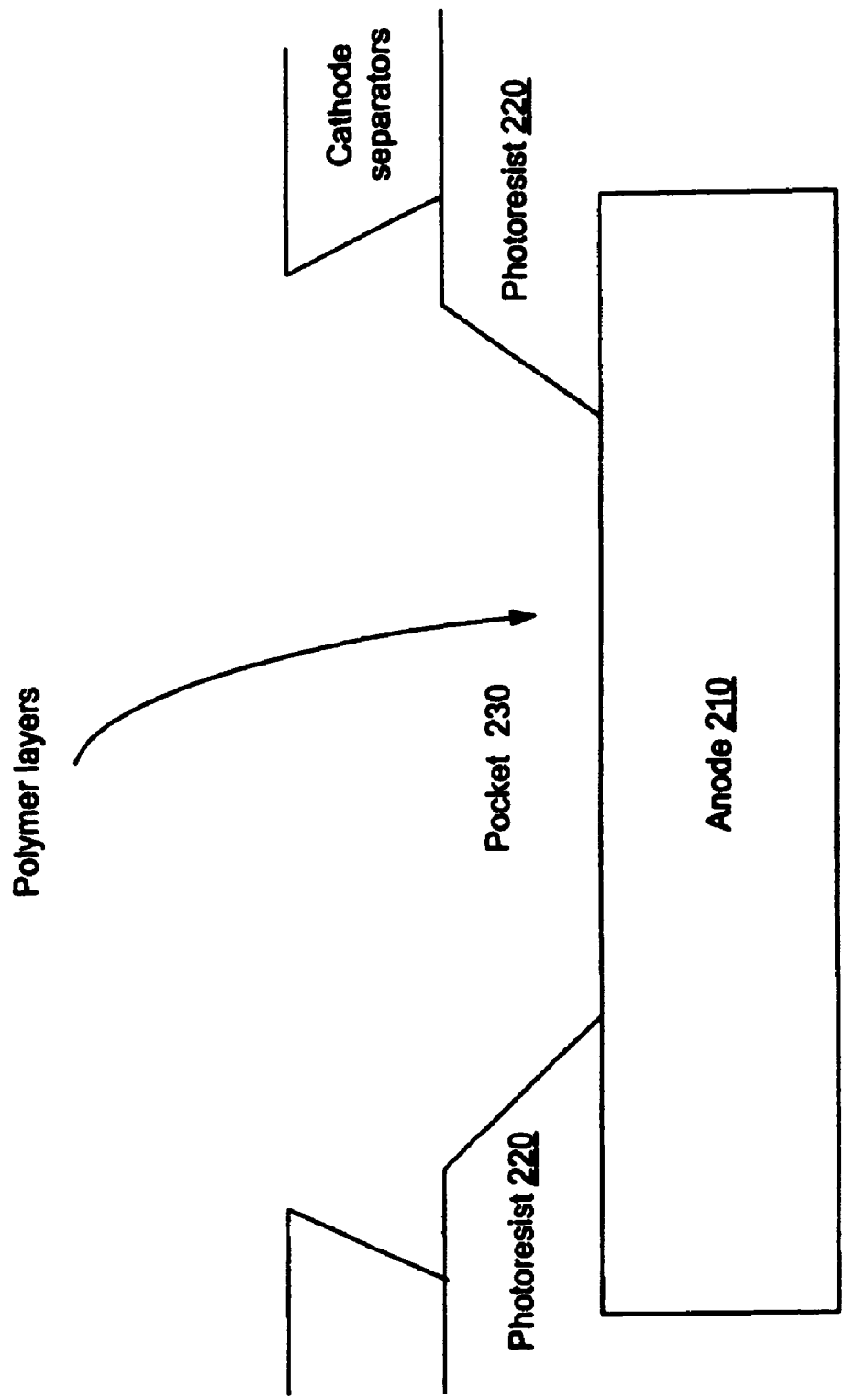
FIG. 2 pockets defined by a layer a photo-resist in an electronic device under fabrication.
Figure 3:
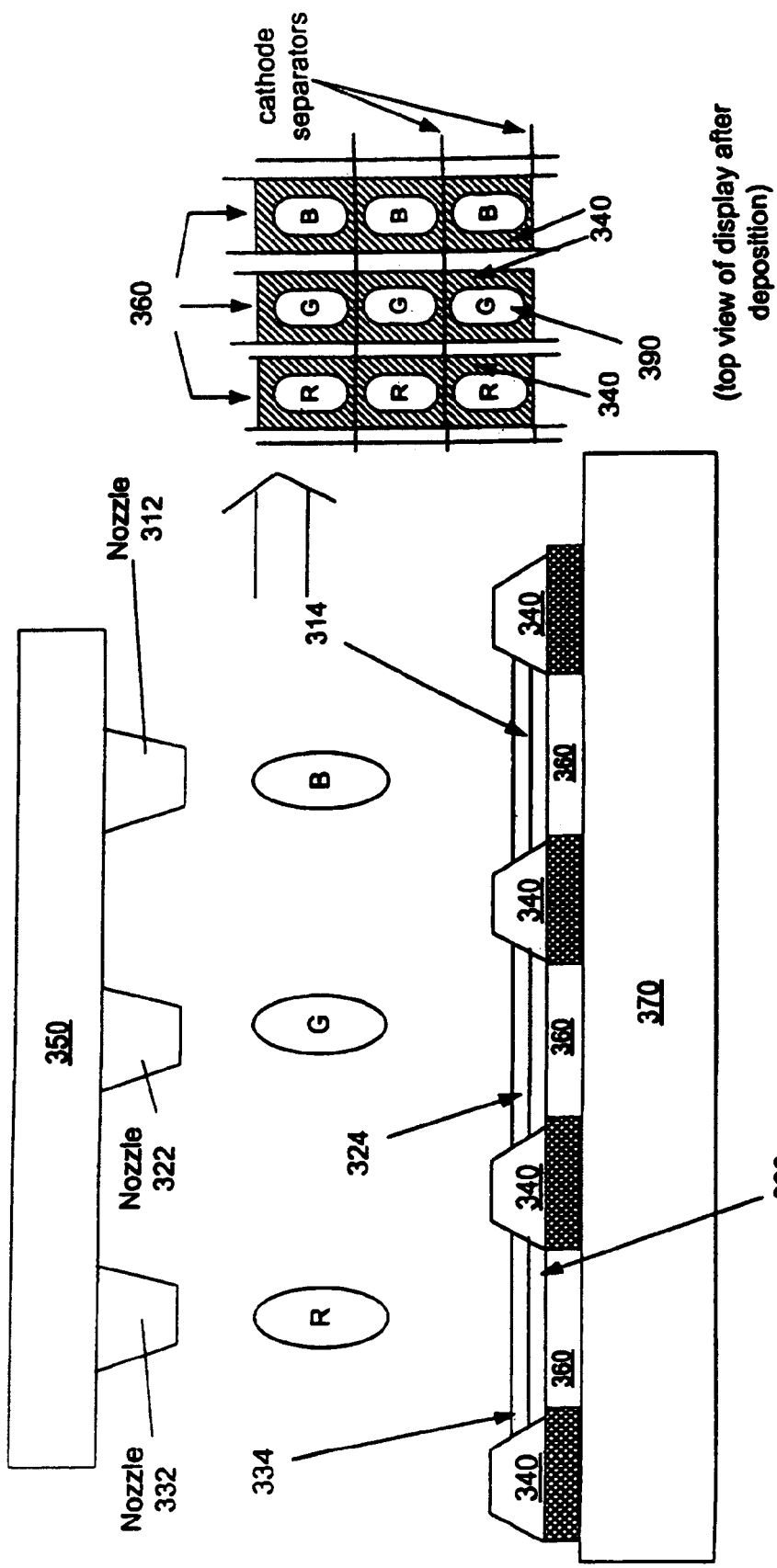
FIG. 3 illustrates an example of an inkjet printing system for fabricating patterned surfaces.
Figure 4:
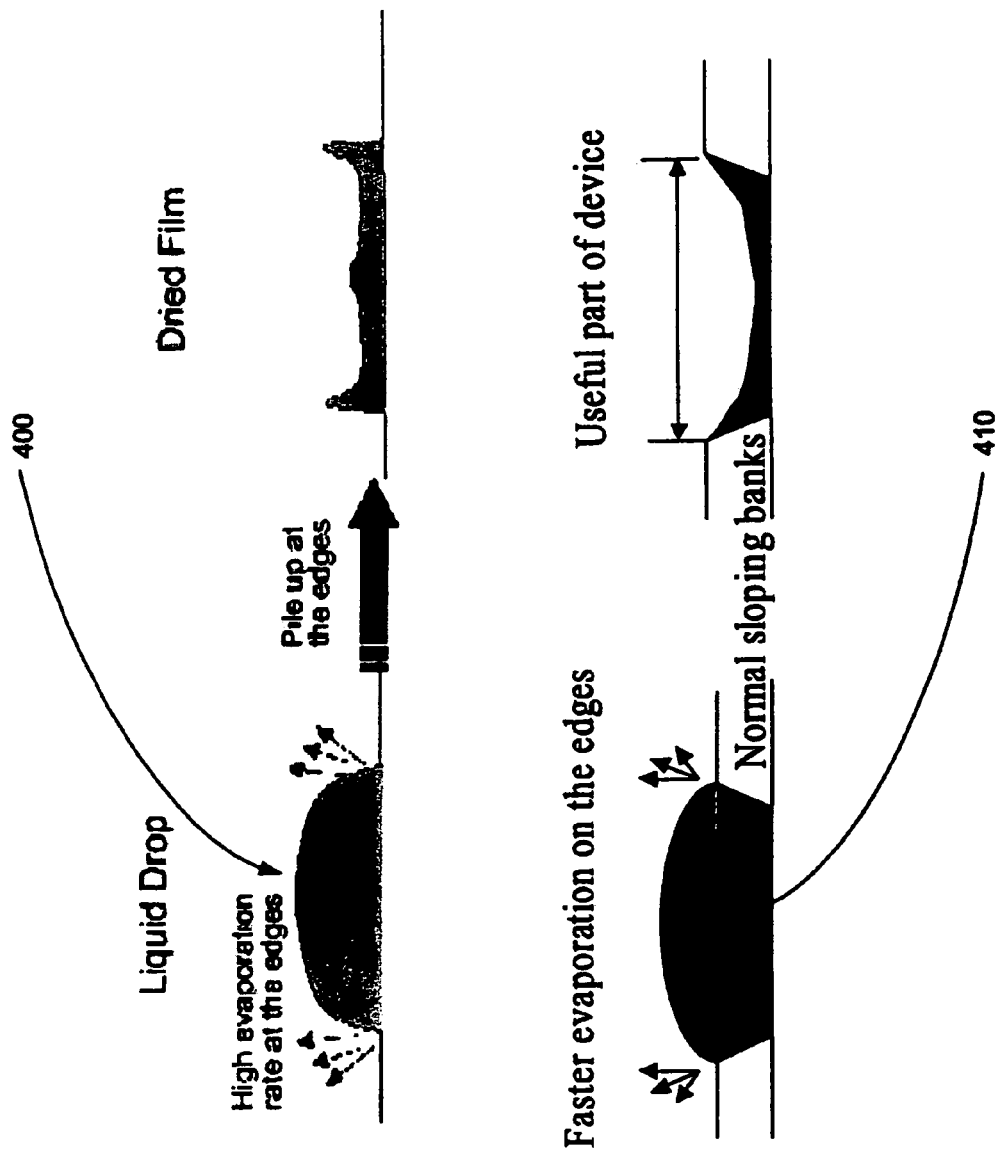
FIG. 4 illustrates the drying pattern of a liquid substance when the substance is dropped with typical height photo-resist banks.
Figure 5:
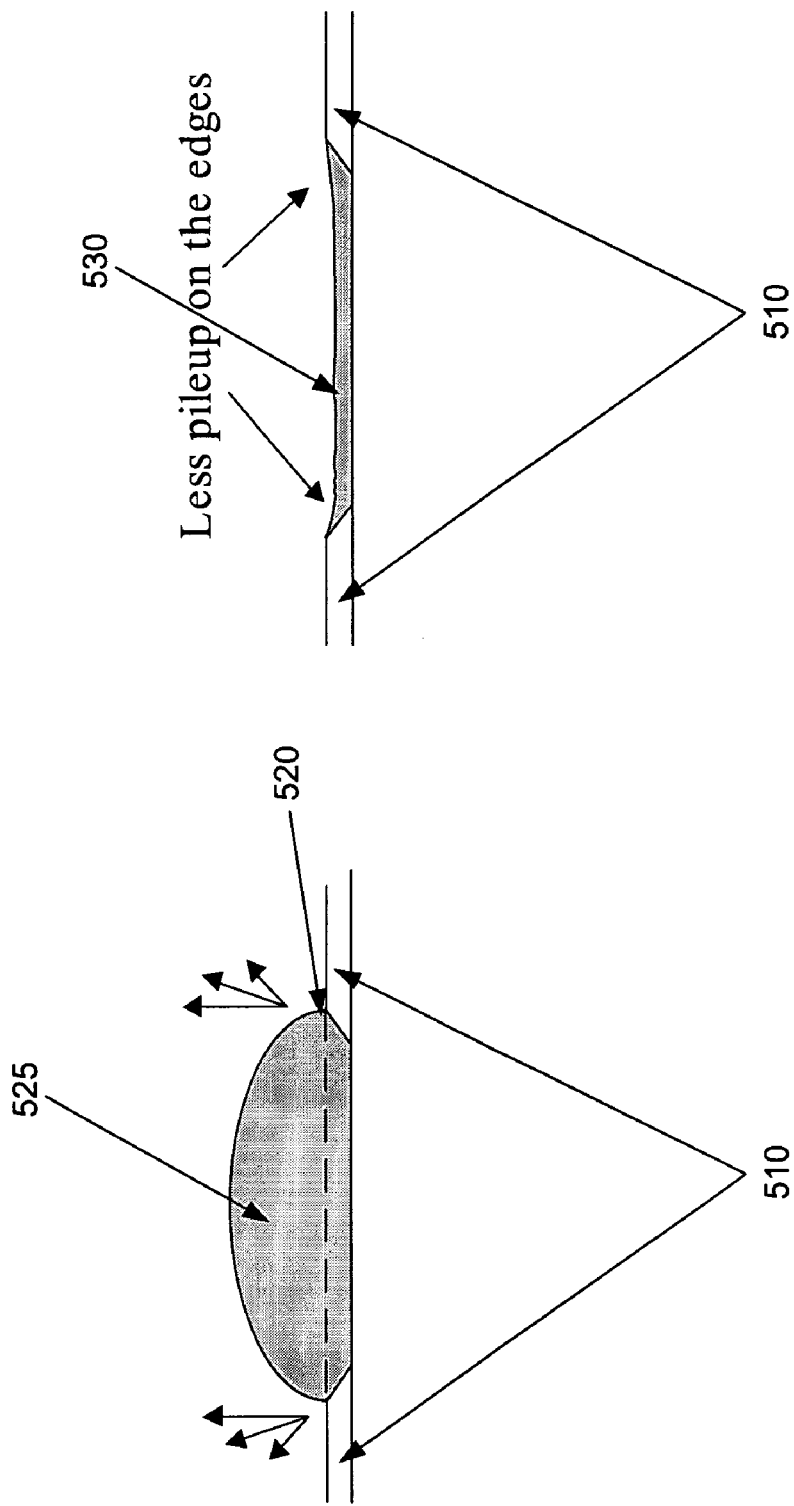
FIG. 5 illustrates the drying profile of a substance dropped into thin photo-resist banks in accordance with the invention.

FIG. 5 illustrates the drying profile of a substance dropped into thin photo-resist banks in accordance with the invention. A mass of organic liquid solution 525 is dried into a film 530 by normal process of evaporation after being deposited into a pocket defined by the photo-resist bank 510. The height of the photo-resist bank 510 is lower than in typical photo-resist banks. As a result, the pinning line 520, which is defined as a line drawn across the top edge of the photo-resist bank 510 wall, is at a much lower level as measured against the height of the drop. This lower pinning line 520 leads to less pile-up at the wall of the photo-resist bank 510. Consequently, the dried film 530 which results from the drying of solution 525 has a flatter more uniform profile especially at the edges of the film 510 where it meets the photo-resist bank 510. This effect has been observed in experiments where the thickness of dried liquid was found more uniform over the useful area of the pocket. The solution 525 is assumed in this example to have spread or be of sufficient volume to contact the side walls of the thin photo-resist banks 510 as shown.

Figure 6:
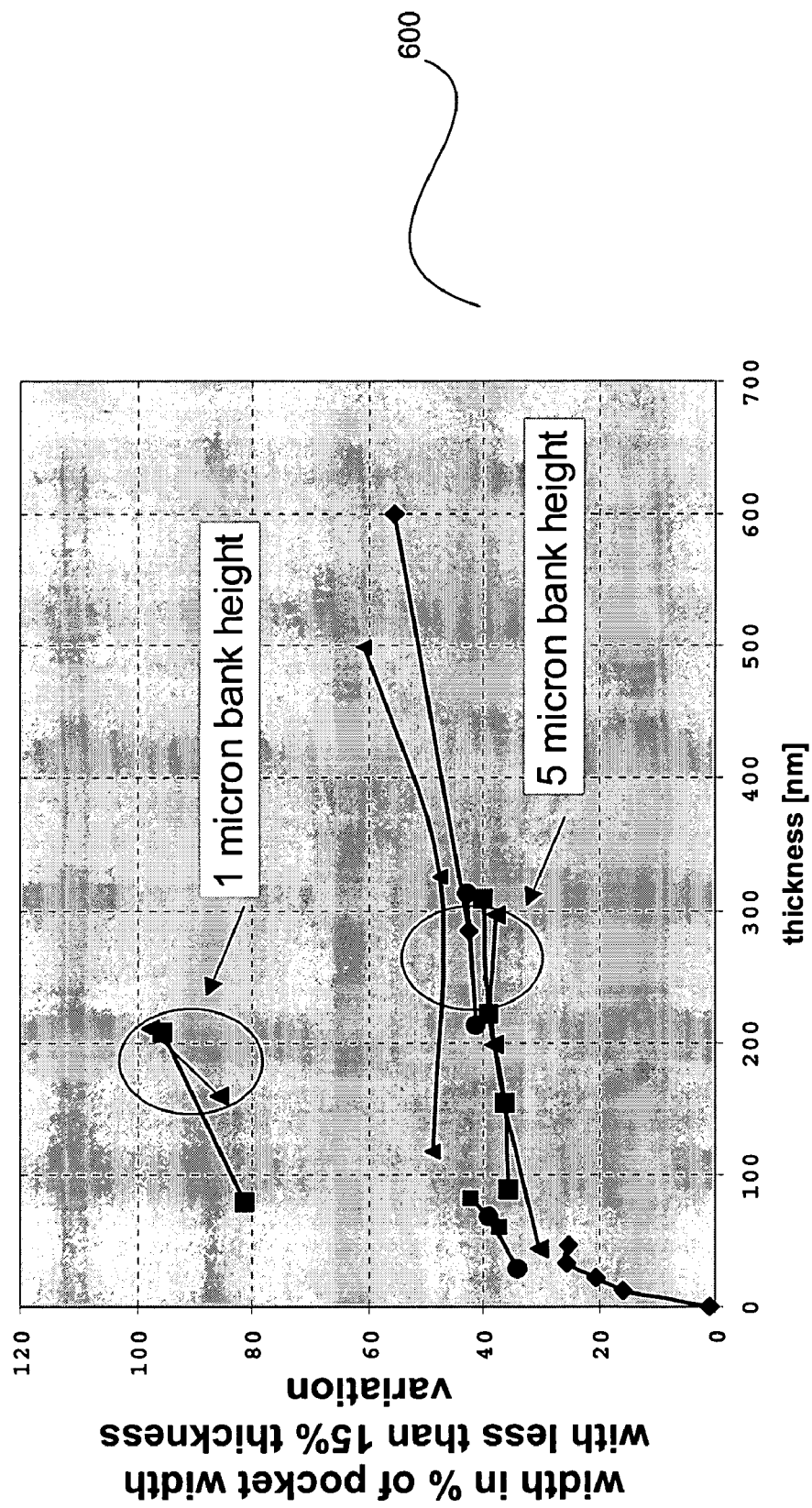
FIG. 6 illustrates the results of experiments carried out on drying liquid films for pockets defined by differing heights of photo-resist banks.

FIG. 6 illustrates the results of experiments carried out on drying liquid films for pockets defined by differing heights of photo-resist banks. The vertical axis of graph 600 is the percentage of the width of the pocket where the variation in thickness fell within a tolerance of 15% (of the minimum film thickness seen in the pocket). The horizontal axis is a measure of the thickness of the film samples under experiment. As can be observed, at a bank height of approximately 5 microns, only about 40% of the entire width of the film had an acceptable (less than 15%) thickness variation (at a film thickness of 100–300 nanometers).

By contrast, drops of liquid dried into films in pockets having much shorter photo-resist banks had a much greater percentage of the width of the dried film falling within the acceptable tolerance of a 15% thickness variation. In one set of samples, where the height of the photo-resist banks was kept at one micron, all thicknesses of films between 50–200 nanometers exhibited more than 80% of the width of the film had a thickness variation within 15% across it. Thus, only 20% or less of a film could be considered non-uniform. The films dried between one micron high photo-resist banks thus exhibit more uniformity in thickness and hence a flatter profile than those films dried between the typical 5 micron high photo-resist banks.

Figure 7:
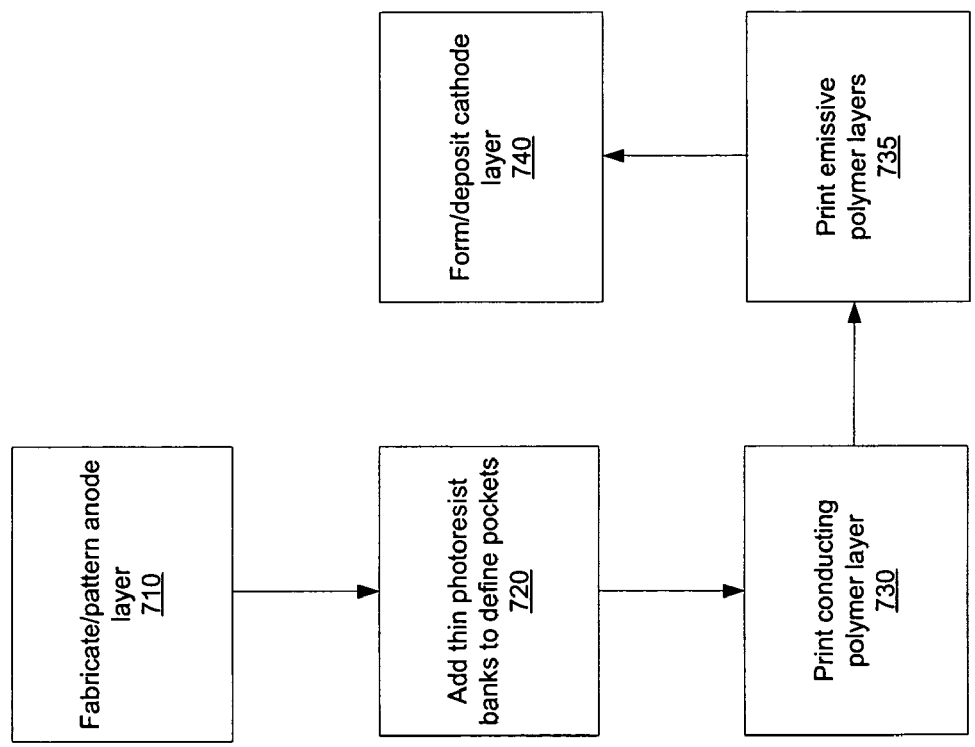
FIG. 7 shows a detailed workflow of fabricating an OLED in accordance with the invention.

An exemplary workflow of fabricating an OLED in accordance with the invention is shown in FIG. 7. First, an anode layer is fabricated/patterned over a substrate (step 710). The substrate may be made of materials such as glass, quartz, silicon, plastic and so on in a single plate. Typical anode materials include metals (e.g. aluminum, silver, copper, indium, tungsten, lead etc.); metal oxides; graphite; doped inorganic semiconductors (such as doped silicon, gallium arsenide and the like); and doped conducting polymers (such as polyaniline, polythiopene and the like). The anode layer is usually thin enough so as to be semi-transparent and allow at least a fraction of light to transmit through. As such, any thin-film deposition method may be used in the fabricating step 710. These include, but are not limited to, vacuum evaporation, sputtering, electron beam deposition, chemical vapor deposition, etching and other techniques known in the art and combinations thereof. The process also usually involves a baking or annealing step in a controlled atmosphere to optimize the conductivity and optical transmission of anode layer. Photolithography is then used to define the pattern in the anode lines. Other steps (not shown) like adding metal lines to connect the anode lines to power sources may also be included in the workflow. Generally, the workflow of FIG. 7 is not intended to be all-inclusive and is merely exemplary. For instance, after the OLED is fabricated it is often encapsulated to protect the layers from environmental damage or exposure. Such other processing steps are well-known in the art and are not a subject of the invention.

In accordance with the invention, the next step is to add photo-resist banks under a height of three microns (and preferably one micron) such that pockets in the anode layer are defined (step 720). The photo-resist banks are fabricated by applying a semi-liquid solution containing the photo-resist material onto the substrate (or anode layer) and then spinning the device under manufacture. Photo-resist material is usually classified in two types, either positive or negative. Positive photo-resist is photo-resist which dissolves wherever exposed to light. Negative photo-resist is photo-resist which dissolves everywhere except where exposed to light. Examples of negative photo-resist material include AZ 5214E manufactured by Clariant. Either positive or negative photo-resist can be used as desired in forming the thin banks which define the inkjet pockets.

The thickness of the photo-resist (which is the height of the photo-resist when viewed from the side) can be shown to be given by the following relation:

$$T = kp^2/W^{1/2}$$

where k is a spinning constant (usually between 80 and 100), p is the percentage of solids content in the liquid solution, and w is the rotational speed of spinning in RPMs (revolutions per minute) per thousand. By adjusting these parameters, a photo-resist height of three microns or less, and preferably, one micron, can be readily achieved by those of ordinary skill in the art. Once the photo-resist is applied it is baked, developed, etched (or lifted back) and so on in order to obtain the desired shape of pockets. Photo-resist chemistry and processes such as lithography, baking, developing, etching, lifting back and radiation exposure which can be used in patterning the photo-resist into pocket-defining banks are known to those of ordinary skill in the art. While baking and other processes may adjust the height of the photo-resist banks, such processes can be taken into account by those of ordinary skill in the art in order to obtain the desired thin height.

Next, the conducting polymer layer is printed (step 730). The conducting polymer layer is used to enhance the hole yield of the OLED relative to the potential applied across it and thus, aids in more energy-efficient injection of holes into the emissive polymer layer for recombination. The conducting polymer layer is sometimes applied as solution and laid down using techniques such as spin coating, dip coating, roll coating, spray coating or thermal evaporation. In accordance with the invention, the conducting polymer layer is applied using printing techniques such as ink-jet printing (screen printing, flexo-graphic printing). Particularly, in this instance, the conducting polymer layer is printed onto the anode layer in pockets defined by thin photo-resist banks. The conducting polymer layer is printed by depositing a liquid substance containing the conducting polymer into the pocket and allowing the substance to dry. The dried film then represents the conducting polymer layer. The conducting polymer layer is a p-type material that transports holes effectively to the emissive polymer layer.

The conducting polymer layer is also referred to as a hole transport layer ("HTL"). The conducting polymer layer is used to improve, for example, the charge balance, the display stability, the turn-on voltage, the display brightness, the display efficiency, and the display lifetime. The conductive polymer layer can be formed from, for example, a solution comprised of water, polyethylenedioxythiophene ("PEDOT"), and polystyrenesulfonic acid ("PSS") (this solution is referred to, herein, as a PEDOT:PSS solution).

Then according to step 735, the emissive polymer layers are printed. The emissive polymer layer is primarily responsible for the emission of light from the OLED and is thus an electroluminescent, semi-conducting and organic (organo-metallic) type material.

Emissive polymers include the various families, copolymers, derivatives and moieties of polyfluorene, polyphenylenevinylene, polyarylenevinylene, polyquinoline, and so on. Examples of such organic electroluminescent materials that may make up the emissive polymer layer include:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers; and (ix) polyp-phenylene and its derivatives substituted at various positions on the phenylene moiety, including ladder polymer derivatives such as poly(9,9-dialkyl fluorene) and the like; (x) poly(arylenes) where the arylene may be such moieties as naphthalene, anthracene, furylene, thienylene, oxadiazole, and the like; and their derivatives substituted at various positions on the arylene moiety; (xi) co-polymers of oligoarylenes such as those in (x) with non-conjugated oligomers;

(xii) polyquinoline and its derivatives;

(xiii) co-polymers of polyquinoline with p-phenylene substituted on the phenylene with, for example, alkyl or alkoxy groups to provide solubility; and (xiv) rigid rod polymers such as poly(p-phenylene-2,6-benzobisthiazole), poly(p-phenylene-2,6-benzobisoxazole), poly(p-phenylene-2,6-benzimidazole), and their derivatives.

Another example of a poly-fluorene based organic electroluminescent material that emits green light is the Lumation Green 1300 series from Dow Chemical, Midland, Mich.

In inkjet printing, there may be a plurality of different emissive polymer substances. For instance, there may be red, green and blue emitting emissive polymers in the print head which are deposited depending upon the desired color to be emitted in a given pixel location which is defined by a pocket. The emissive polymer layers are printed above the conducting polymer layer and in much the same fashion. The emitting polymer substances are deposited on the conducting polymer layer by the print head in the exact area defined by the pockets (which are defined by the thin bank photo-resist in accordance with step 720). The emissive polymer layer results from the drying of the substance deposited by the print head.

Both the conducting polymer layers and emissive polymer layers can be printed by depositing a liquid in between the photo-resist banks which define a pocket. This liquid may be any "fluid" or deformable mass capable of flowing under pressure and may include solutions, inks, pastes, emulsions, dispersions and so on. The liquid may also contain or be supplemented by further substances which affect the viscosity, contact angle, thickening, affinity, drying, dilution and so on of the deposited drops.

After the emissive polymer layer is printed, the cathode layer is formed/deposited (step 740). The cathode layer is typically a combination of a layer of pure metal and a lower-work function metal or a high band gap metal fluoride or metal oxide. While the cathode layer can be comprised of many different materials, preferable materials include aluminum, silver, magnesium, calcium, barium, or combinations thereof. More preferably, the cathode layer is comprised of aluminum, aluminum alloys, or combinations of magnesium and silver. Low work function material which may combined with a pure element/metal include oxides such as cesium oxide or barium oxide. Insulating materials such as LiF, NaF, CsF and so on may also be used below the metal layer to enhance injection by tunneling. The cathode layer is formed/deposited typically using vacuum evaporation or similar techniques and often using specially designed deposition devices. Often other steps such as the addition of masks and photo-resists may precede the cathode deposition step 740. However, these are not specifically enumerated as they do not relate specifically to the novel aspects of the invention.

While the embodiments of the invention are illustrated in which it is primarily incorporated within an OLED display, almost any type of electronic device that uses dried film layers may be potential applications for these embodiments. In particular, present invention may also be utilized in a solar cell, a transistor, a phototransistor, a laser, a photo-detector, or an opto-coupler. It can also be used in biological applications such as bio-sensors or chemical applications such as applications in combinatorial synthesis etc. The OLED display described earlier can be used within displays in applications such as, for example, computer displays, information displays in vehicles, television monitors, telephones, printers, and illuminated signs.

What is claimed is:

1. A method of fabricating an organic electronic device, said method comprising:

patterning a lower conducting layer upon a substrate;

fabricating a photo-resist layer upon said lower electrode layer, said photo-resist layer having a height of not more than three microns, said photo-resist layer patterned into banks to define pockets upon said lower electrode layer, each pocket defining an active region of said device; and depositing at least one liquid substance into each said pocket, wherein said at least one liquid substance includes at least one polymer and is allowed to dry into layers contained within said pockets.

2. A method according to claim 1 wherein said substance when dried has a substantially flat and substantially uniform profile.

3. A method according to claim 1 wherein said organic electronic device is an organic light emitting diode (OLED) display.

4. A method according to claim 3 wherein each said pocket defines at least one of a pixel and a sub-pixel of said display.

5. A method according to claim 4 wherein said at least one liquid substance includes an emissive polymer, said emissive polymer emitting light upon application of electrical energy thereto, said layers including an emissive polymer layer fabricated from said emissive polymer.

6. A method according to claim 5 further comprising:
fabricating an upper conducting layer above said dried layers, said upper conducting layer and said lower conducting layer conducting electrical energy to said emissive polymer layer.

7. A method according to claim 6 wherein said at least one liquid substance includes conducting polymer, said layers including a conducting polymer layer formed by drying of said conducting polymer, said conducting polymer layer disposed under said emissive polymer layer.

8. An organic light emitting diode (OLED) display comprising a plurality of pixels, each pixel emitting light, the display comprising:
a lower electrode layer;
a photo-resist layer, said photo-resist layer fabricated upon said lower electrode layer, said photo-resist layer having a height of less than or equal to three microns, said photo-resist layer patterned into a plurality of banks to define pockets upon said lower electrode layer, each pocket defining the active region of each of said pixels;
a plurality of polymer layers contained within said pockets, said polymer layers formed by dropping at least one liquid substance into each of said defined pockets and allowing said at least one liquid substance to dry therein; and
an upper electrode layer patterned above said polymer layers, said upper and lower electrode layers conducting electrical energy to said plurality of polymer layers causing at least one of said polymer layers to emit light thereby.

9. A display according to claim 8 wherein said at least one liquid substance includes at least partially organic materials.

10. A display according to claim 9 wherein said polymer layers include:
a conducting polymer layer which aids in the transport of electrical energy; and
an emitting polymer layer emitting light upon activation by electrical energy.

11. A display according to claim 10 wherein said light is emitted in at least one of a white, red, green or blue color.

12. A display according to claim 10 wherein said lower electrode layer is an anode layer and said upper electrode layer is a cathode layer.

13. A display according to claim 8 wherein the height of the photo-resist banks is based upon the amount of said at least one liquid substance to be dropped in each pocket.

14. The display of claim 13, wherein the height of the photo-resist banks is optimized based upon properties of said at least one liquid substance to be dropped into each pocket.

15. A display according to claim 8 wherein said at least one liquid substance when dried has a substantially flat and substantially uniform profile.

16. A display according to claim 15 wherein said profile has a thickness variation of less than about 15% across about 80% of a width of the at least one liquid substance when dried.

* * * * *